(12) United States Patent
Mullen

(10) Patent No.: US 8,754,322 B2
(45) Date of Patent: Jun. 17, 2014

(54) HARVESTING AND AGGREGATING LOW PHOTONIC ENERGY

(75) Inventor: Ruth Ann Mullen, Bellevue, WA (US)

(73) Assignee: Empire Technology Development, LLC, Wilmington, DE (US)

( * ) Notice: Subject to any disclaimer, the term of this patent is extended or adjusted under 35 U.S.C. 154(b) by 1402 days.

(21) Appl. No.: 11/934,564

(22) Filed: Nov. 2, 2007

(65) Prior Publication Data
US 2010/0326502 A1  Dec. 30, 2010

Related U.S. Application Data

(60) Provisional application No. 60/864,392, filed on Nov. 3, 2006.

(51) Int. Cl.
*H01L 31/055* (2014.01)
(52) U.S. Cl.
USPC .......................................... 136/254; 136/252
(58) Field of Classification Search
USPC .................................................. 136/254, 252
See application file for complete search history.

(56) References Cited

U.S. PATENT DOCUMENTS

| | | | |
|---|---|---|---|
| 4,004,572 A | 1/1977 | Nathan et al. | |
| 4,594,720 A | 6/1986 | De Young | |
| 4,629,821 A | 12/1986 | Bronstein-Bonte et al. | |
| 6,569,249 B1 | 5/2003 | Singh et al. | |
| 6,819,845 B2 | 11/2004 | Lee et al. | |
| 7,067,293 B2 | 6/2006 | Labelle et al. | |
| 7,125,578 B1 | 10/2006 | Mcbranch | |
| 7,863,517 B1 * | 1/2011 | DiDomenico | ................ 136/253 |
| 2003/0228727 A1 | 12/2003 | Guerra | |
| 2005/0061364 A1 | 3/2005 | Peumans et al. | |
| 2006/0185714 A1* | 8/2006 | Nam et al. | ..................... 136/244 |

FOREIGN PATENT DOCUMENTS

WO   WO 2007/130025 A1 * 11/2007 ............. H01L 51/44

OTHER PUBLICATIONS

Heebner et al., "Slow Light, Induced Dispersion, Enhanced Nonlinearity, and Optical Solutions in a Resonator-array Waveguide," Physical Review E, Mar. 2002, 4 pages, vol. 65, No. 3.
Vahala, K., "Optical Microcavities," Nature, Aug. 14, 2003, pp. 839-846, vol. 24.
International Search Report and Written Opinion of the International Searching Authority for PCT/US07/83654 mailed May 15, 2008 (9 pages).
International Preliminary Report on Patentability for PCT/US2007/083654, mailed May 14, 2009, 7 pages.

* cited by examiner

*Primary Examiner* — Golam Mowla
(74) *Attorney, Agent, or Firm* — Moritt Hock & Hamroff LLP; Steven S. Rubin, Esq.

(57) ABSTRACT

In various embodiments, energy is harvested from a plurality of photons of received light, each photon having energy below an activation energy threshold of a photon activated process. The harvested energy from one or more of the photons is aggregated until the aggregated energy exceeds the activation energy level. The aggregated energy is then outputted, to e.g. a photolytic power source, a photovoltaic power source or a laser gain media.

5 Claims, 3 Drawing Sheets

HARVESTING AND AGGREGATING LOW PHOTONIC ENERGY

RELATED APPLICATIONS

The present non-provisional application claims priority to provisional application No. 60/864,392, entitled "Bio-Inspired Two-Photon Absorption," filed Nov. 3, 2006.

TECHNICAL FIELD

Embodiments of the present invention relate generally to the field of solar energy. More specifically, embodiments of the present invention relates to harvesting and aggregating low photonic energy.

BACKGROUND

Currently, photolytic and photovoltaic power sources only utilize that portion of the solar spectrum that contains photons having energy greater than or equal to the energy threshold required to activate the photovoltaic or photolytic process. Lower energy photons, that is, photons with energy lower than the threshold required to activate the photovoltaic or photolytic process, are currently wasted.

Similarly, solar pumping of a laser gain media also typically only uses that portion of the solar spectrum that contains photons having energy greater than or equal to the absorption threshold. Lower energy photons, that is, photons with energy lower than the absorption threshold, likewise are currently wasted.

BRIEF DESCRIPTION OF THE DRAWINGS

Embodiments of the present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Illustrative embodiments of the present invention include, but are not limited to, methods and apparatuses for harvesting and aggregating energy from low energy photons to drive a photon activated or photon absorption process. The various methods and apparatuses substantially improve the efficiency with which energy can be harvested from the solar spectrum and can be used to generate electricity for either immediate utilization and/or for storage, or for pumping a laser gain medium. In one group of embodiments, the temporal and spatial cross section for capturing photons is increased, and in another group of embodiments, the temporal and spatial cross section for delivering energy to electrons is increased. Embodiments of the two groups may be employed separately or together.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(B) or (A B)", that is, A is optional.

Figure 1:
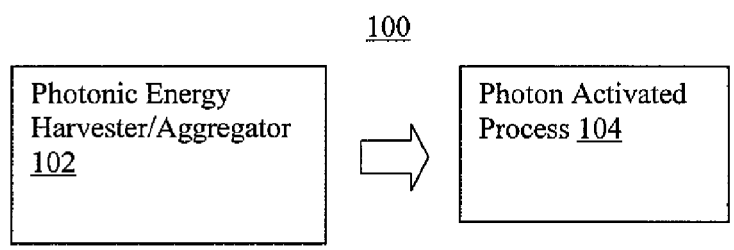
FIG. 1 illustrates an overview of embodiments of the present invention.

FIG. 1 illustrates an overview of the present invention, in accordance with various embodiments. As illustrated, embodiments of the present invention 100 include methods and apparatuses 102 for harvesting and aggregating energy from photons with energy below the activation threshold of a photon activation process 102, and use the aggregated energy to drive or contribute to driving the photon activation process 102. For the purpose of this application, the term "low energy photon" refers to a photon having energy below a triggering threshold of a target process, which may be, but is not limited, to any one of a number of photon activated processes.

More specifically, embodiments of the invention advantageously enable the energy of two low-energy photons to be absorbed and combined together to create a larger quantum of energy, with enough energy to activate a photovoltaic or photolytic energy harvesting device, which e.g. may be an efficient, affordable, readily-manufacturable, and/or environmentally robust photovoltaic or photolytic energy harvesting device. Prior to the disclosed embodiments of the invention, only those photons having higher energy than is needed to drive a photo-activation center can contribute to light harvesting because no mechanisms exist for the absorption of lower-energy photons. For the purposes of this application, the term "collaborate" refers to the process by which two photons are absorbed by a photoabsorber having an absorption energy greater than either of the two individual photons but less than or equal to the sum of the energies of the separate photons. Embodiments of the invention may additionally provide a mechanism to capture the energy-difference between the energy of an incident high-energy photon and the energy of the photo-activation center.

Further, embodiments of the invention may substantially increase the cross section for multi-photon absorption, enabling the occurrence of multi-photon absorption at the substantially lower optical power levels provided by natural sunlight. By contrast, prior to the disclosed embodiments of the invention, the occurrence of multi-photon absorption normally only occurs at the very high optical intensities that can be achieved with short-pulse and/or high power lasers. The probability of two photons simultaneously arriving at a chemical, electrochemical, electrolytic, or electrical activation center within a time period equal to the lifetime of the chemical activation center's real or virtual intermediate state is nearly zero. Embodiments of the invention extend the temporal presence of photons with the activation center by holding the photons in close proximity to the relevant activation center, and in a physical structure that has a larger spatial cross section than the activation center itself.

Embodiments of the invention will be described below as two groups, which as alluded to earlier, may be used either separately or together, to increase the multi-photon cross section for the photo-activation reaction. The first group of embodiments involves the temporal and/or spatial localization of light, whereas, the second group of embodiments involves the temporary storage of the energy from one or more of these photons in what is essentially an electronic energy buffer. The grouping is mainly for ease of understanding, and should not be read as limiting on the scope of the invention.

The first group of embodiments captures or traps light in nano-scale, micro-scale or macro-scale structures. Appropriate nano-scale structures include, but are not limited to, photonic bandgap structures. For one-dimensional embodiments, the photonic bandgap structures are sometimes referred to as thin film filters. Photonic bandgap structures may also be fabricated as two-dimensional structures, which are sometimes referred to as planar photonic bandgap structures or nano-ring resonators. Photonic bandgap structures may also be fabricated as three-dimensional structures, which are sometimes referred to as photonic bandgap crystals. Methods for engineering and fabricating these nano-scale structures and micro-scale structures may employ one or more techniques such as photolithography, reactive ion-etching, wet chemical etching, nano-scale contact printing, and other equivalents.

Methods and designs for macro-scale structures may include, but are not limited to, the use of long loops of conventional and/or "holey" optical fiber.

Additionally, electronic resonances in certain atoms and molecules, in the art of non-linear optics, may also be employed to effectively trap light (or, perhaps more accurately, slow down the group velocity of the light). Appropriate nano-scale structures for increasing the cross-section for multi-photon absorption may include materials such as stained glass in which nanoscopic metal particles designed to support surface plasmon waves resonating around the metallic nanoparticles, onto which appropriate charge-generating chemical moiety can be attached.

The second group of embodiments includes employment of a conducting membrane having chemical species that are readily ionized by single low-energy photons. The membrane may be configured to have conductivity sufficiently high that electrons, once generated on one side of the membrane will move (either via diffusion or in the presence of external electrical field, via drift) either across or along the membrane sufficiently far that the recombination of the electron into the charge-generating moiety is prohibited. The energy from a photon will in this way be temporarily stored in what is essentially an electronic energy buffer.

Secondary and tertiary photo-activated electron generators absorbing over a range of energies will enable efficient collection and storage of energy from multiple parts of the solar spectrum. Additional photons absorbed by these conduction electrons in the membrane will further excite the electrons. In this way, multiple photons will be added together to create quanta of energy sufficiently large to drive the photolytic (and/or photovoltaic) reaction.

While the above discussion references electron generation, it should be noted that the processes can also be driven by holes, that the coupling of a photo-generated electron with a photo-generated hole is called an exciton, and that excitons in an appropriately-designed conducting structure can also be further-excited by photons, providing yet another mechanism for facilitating the multi-photon absorption required to add two or more lower-energy photons to get a single photon with enough energy to drive higher-energy photolytic or photovoltaic processes.

The above processes were described in the context of two-photon absorption for ease of understanding. It is not meant to be limiting on the scope of the invention. As those skilled in the art can readily appreciate from the disclosure provided above, the processes can be readily-extended to the facilitation of the generalized case of multi-photon absorption.

Figure 2:
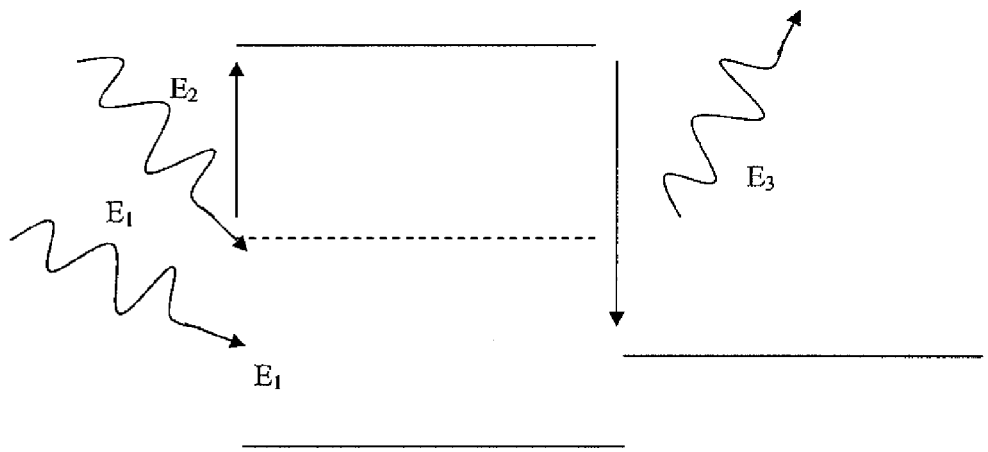
FIG. 2 illustrates aggregating energy of two low energy photons, in accordance with various embodiments of the present invention.

An exemplary instantiation of the invention may be by the use of a microspheroidal resonator to facilitate two-photon absorption in a laser gain medium having a very short-lived intermediate state as shown by the dashed line in the energy-level diagram of FIG. 2. As illustrated, two photons having energies $E_1$ and $E_2$ can together excite an atom or molecule to an upper state, provided that two photons strike the atom or molecule during a time period less than or equal to the lifetime of the real or virtual intermediate state. In FIG. 2, $E_1 < E_2 < E_3$ and $(E_1 + E_2)$ is greater than or equal to $E_3$, but other energy relationships are also possible. Once in the excited state, the atom or molecule will emit a photon of energy $E_3$.

While the appropriate simultaneity of this two-photon arrival is normally rare at the low optical powers typical of either normal solar fluence or normal optical illumination levels using typical artificial light sources such as light bulbs, LEDs, or typical commercial laser sources, embodiments of the present invention having the energy characteristics illustrated in FIG. 2 substantially increase the cross section for this kind of two-photon absorption event.

Figure 3:
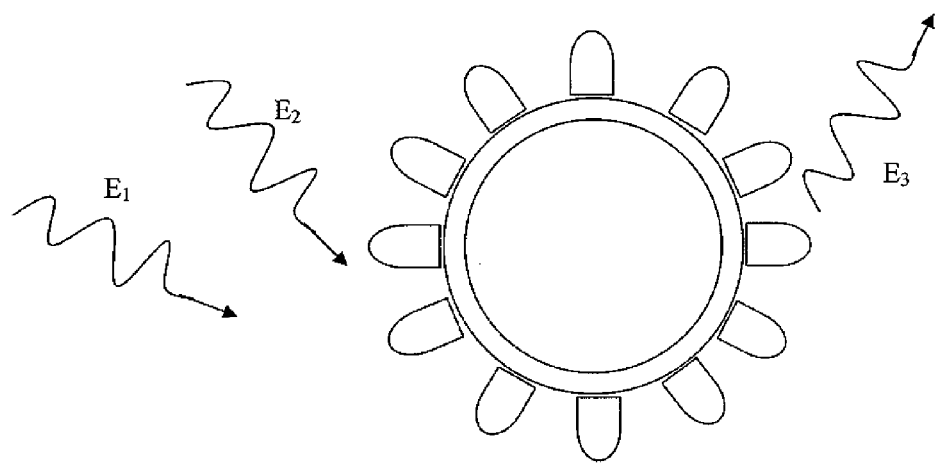
FIG. 3 illustrates a micro-ring resonator suitable for harvesting and aggregating energy of low energy photons, in accordance with various embodiments of the present invention.

FIG. 3 schematically illustrates the use of a micro-ring resonator to spatially "trap" photons. The micro-ring resonator can be either a two-dimensional ring or a three-dimensional sphere. The plan view of the two-dimensional case is shown in FIG. 3. The resonator may be made of a highly transparent material such as quartz. Optical absorbers are shown in the Figure attached to the outside of the resonator, via appropriately tight chemical and/or surface coupling. The optical absorbers have an energy level diagram as shown in FIG. 2, such that they will not absorb single photons having energies of either $E_1$ or $E_2$, but will absorb two photons having a combined energy of $E_1$ and $E_2$ provided they both arrive at the absorber within a time period equal to the lifetime of the molecule's real or virtual intermediate state. By trapping otherwise temporally-separated photons in this ring, the probability for the simultaneous arrival of two photons at an absorber site is substantially increased. FIG. 3 is thus a drawing of a plan (spatial) view illustrating one possible instantiation of the microstructural enhancement of two-photon absorption, as described above.

The above system and/or variations on the above system enable the use of long-wavelength radiation to pump atomic or molecular moieties into excited states from which they emit short-wavelength (higher-energy) radiation. Optical emitters thus excited could be chosen to emit photons having energies appropriate for the photoactivation of photolytically-driven electromechanical reactions, the excitation of photocarriers in a photovoltaic cell, or the excitation of a laser gain medium to an excited state, depending on the desired application.

It should be noted that FIGS. 2 and 3, while designed to illustrate the use of microstructures to enhance two-photon absorption processes, are not meant to be restrictive. Beside micro-ring resonators and nanostructures, other microstructures and macrostructures can all be used in a similar manner, taking into consideration their varying dimensions and resonant Q-factors in the design, and with regard to the associated choice of absorber/emitter characteristics. While the absorber in FIG. 3 is attached to the outside of the ring, it will in some cases be preferable to hybridly embed some of the absorbers in the otherwise transparent material, out of which the ring is made.

Figure 4:
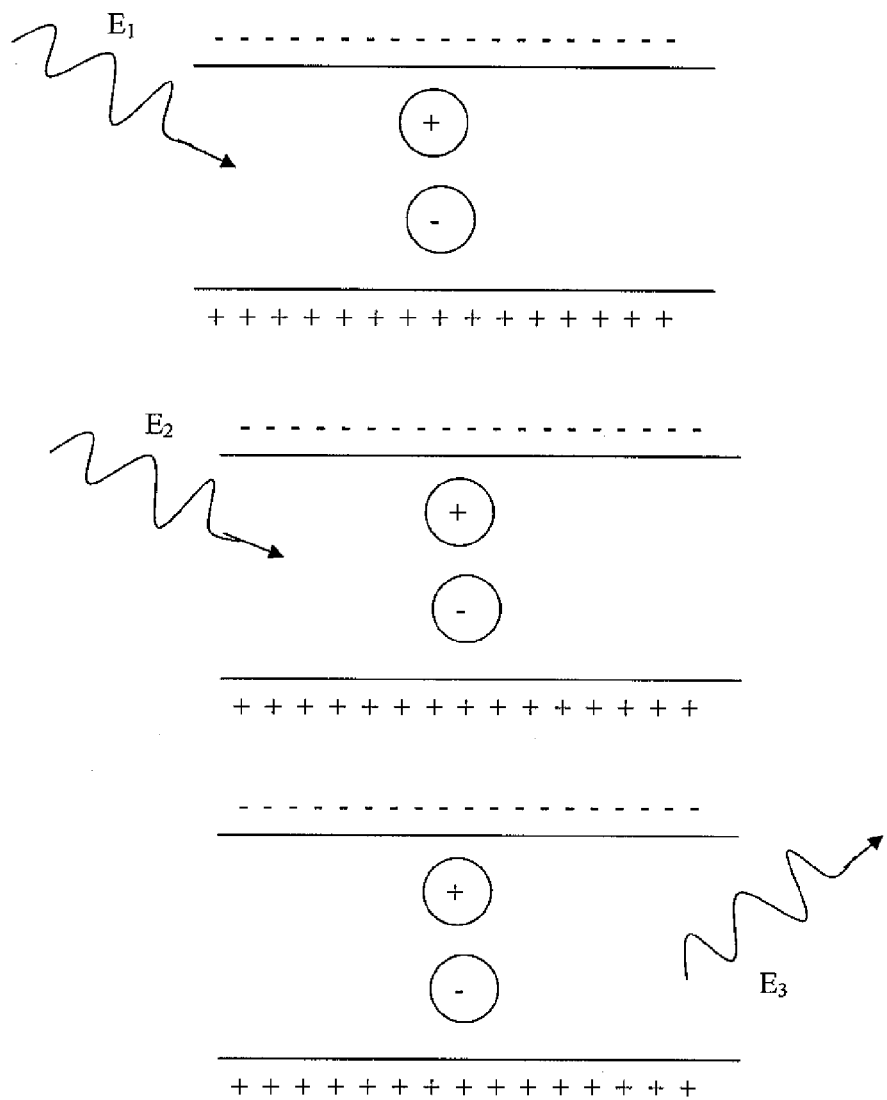
FIG. 4 illustrates aggregating energy of two low energy photons in accordance with various charge carrier embodiments of the present invention.

Additionally, while FIG. 3 illustrates a ring-shaped structure, other shapes are possible including ellipses, race-track loops, and serially-connected racetrack loops that are connected inside one another for compactness. Also, while the output of the example in FIGS. 2 and 3 is a photon, similar systems containing additional charge-generating moieties can be designed in which the output of the system is a charge-carrier. And while FIGS. 2 and 3 illustrate the beneficial effects of photon-trapping, one skilled in the art would appreciate that analogous increases in the cross-section for photons to interact with electrons (or charge carriers) can be achieved by spatially and temporally trapping electrons (or other charge carriers) in appropriately-configured charge-trapping or charge-confining structures. Examples of such charge-confining structures include membranes which restrict the motion of charges except in the plane of the membrane, as illustrated in FIG. 4, and nanowires which restrict the motion of charges except along the direction of the nanowire. Both closed-loop and open-loop structures can be designed to beneficially confine charges in close proximity to the optical structures designed to increase the cross section for interaction between the charges and photons, for application in which it is desirable to optically-excite an electron to a higher energy level.

Embodiments of the invention with efficient light harvesting and efficient conversion of light to electrical, chemical, electrolytic, and/or electrochemical energy have broad applications in diverse industries that involve power usage or generation, including the electric power industry, vehicle propulsion, robotics, consumer applications involving computing and communications, sensors, manufacturing, refrigeration, defense, health care, and other applications.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the present invention. This application is intended to cover any adaptations or variations of the embodiments discussed herein. Therefore, it is manifestly intended that the embodiments of the present invention be limited only by the claims and the equivalents thereof.

What is claimed is:

1. A method comprising:
   receiving light;
   absorbing first energy from a first photon of the received light, the first photon including first energy below an activation energy threshold level of a photon activated process;
   absorbing second energy from a second photon of the received light, the second photon including second energy below the activation energy threshold level of the photon activated process, the second energy collaborating with the first energy to produce third energy, the third energy being greater than both the first energy and the second energy and less than or equal to a combination of the first energy and the second energy, where the third energy exceeds the activation energy threshold level; and
   driving the photon activated process using the third energy;
   wherein absorbing is effectuated through photon trapping using a micro ring resonator having a plurality of photon absorbers disposed around the resonator,
   wherein the photon absorbers comprise nano-scale structures configured to increase a cross section for multi-photon absorption,
   wherein the nano-scale structures comprise materials with nanoscopic metal particles configured to support surface Plasmon waves that resonate around the nanoscopic metal particles, and
   wherein the materials comprise stained glass.

2. The method of claim 1, wherein the receiving comprises receiving sunlight.

3. The method of claim 1, wherein:
   the first photon is received at a first point in time,
   the second photon is received at a second point in time, the second point in time being later than the first point in time by less than a lifetime of a real or virtual intermediate state of an atom or molecule struck by the first photon.

4. The method of claim 1, wherein said driving comprises driving a selected one of a photovoltaic process, a photolytic process, or a laser gain media.

5. The method of claim 4, wherein said receiving comprises receiving sunlight, and said driving comprises driving a laser gain media to fabricate a solar-pumped laser, or to optically power a remotely disposed vehicle or device.

* * * * *

UNITED STATES PATENT AND TRADEMARK OFFICE
CERTIFICATE OF CORRECTION

PATENT NO. : 8,754,322 B2
APPLICATION NO. : 11/934564
DATED : June 17, 2014
INVENTOR(S) : Mullen Page 1 of 1

It is certified that error appears in the above-identified patent and that said Letters Patent is hereby corrected as shown below:

In the Specification

In Column 2, Line 38, delete "activation process 102," and insert -- activation process 104, --, therefor.

In Column 2, Lines 39-40, delete "activation process 102." and insert -- activation process 104. --, therefor.

Signed and Sealed this
Thirteenth Day of January, 2015

Michelle K. Lee
*Deputy Director of the United States Patent and Trademark Office*